(12) United States Patent
Zhang et al.

(10) Patent No.: US 8,115,532 B2
(45) Date of Patent: Feb. 14, 2012

(54) LINEAR MONOTONIC DELAY CHAIN CIRCUIT

(75) Inventors: Shengyuan Zhang, Shanghai (CN);
Shoujun Wang, Ottawa (CA); Yong Wang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 320 days.

(21) Appl. No.: 12/218,486

(22) Filed: Jul. 11, 2008

(65) Prior Publication Data

US 2010/0007398 A1  Jan. 14, 2010

(51) Int. Cl.
*H03H 11/26* (2006.01)
(52) U.S. Cl. ........................ 327/261; 327/272
(58) Field of Classification Search ............ 327/261, 327/269, 270–272, 276–278, 284, 285, 290
See application file for complete search history.

(56) References Cited

U.S. PATENT DOCUMENTS

| | | | | |
|---|---|---|---|---|
| 5,355,037 | A * | 10/1994 | Andresen et al. | 327/158 |
| 6,212,126 | B1 * | 4/2001 | Sakamoto | 365/233.14 |
| 6,573,776 | B2 * | 6/2003 | Miyamoto | 327/158 |
| 7,205,803 | B2 * | 4/2007 | Chung et al. | 327/158 |
| 7,394,300 | B2 * | 7/2008 | Chae | 327/261 |
| 7,486,125 | B2 * | 2/2009 | Chae | 327/285 |
| 7,525,356 | B2 * | 4/2009 | Hui et al. | 327/161 |

* cited by examiner

*Primary Examiner* — Hai L Nguyen
(74) *Attorney, Agent, or Firm* — Hayes and Boone, L.L.P.

(57) ABSTRACT

A method and circuit for generating an adjustable delay signal is presented, wherein the delay can be linear and monotonic with high resolution delay steps. The circuit utilizes one or more serially coupled delay cells and a load cell. Each delay cell comprises an inverter, a nor-multiplexer, and a programmable capacitor, wherein a first control signal is used to control the operation of the nor-multiplexer and a second control signal is used to control capacitance of the programmable capacitor. Values of the first and the second control signals are selected based on any desired range of total delay time and any desired delay time for a specific application of the circuit.

4 Claims, 4 Drawing Sheets

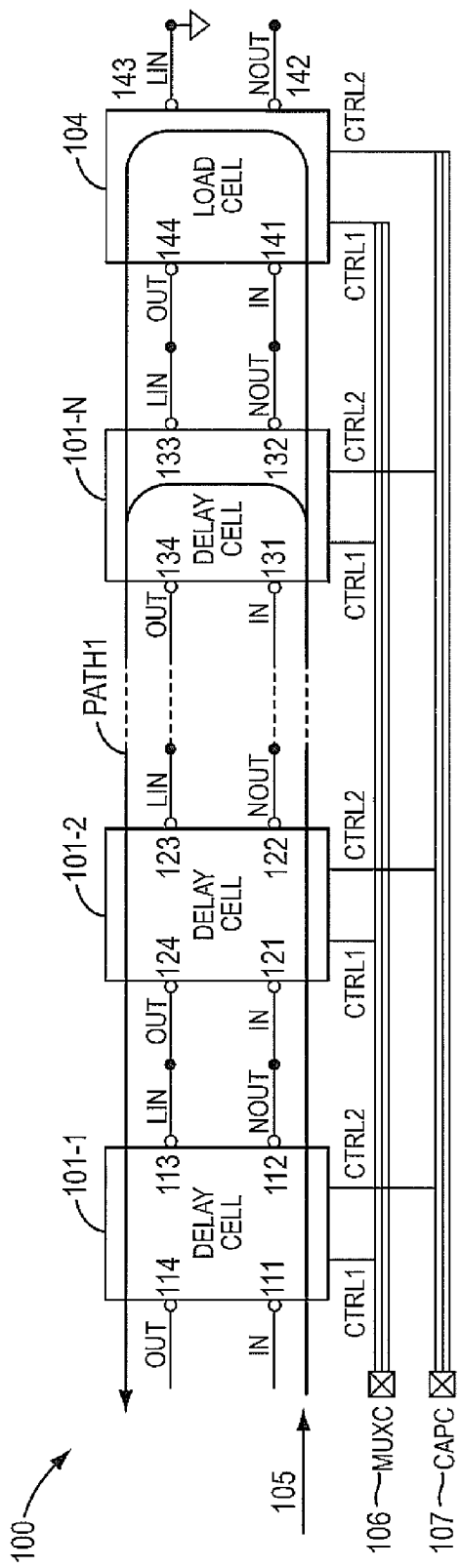
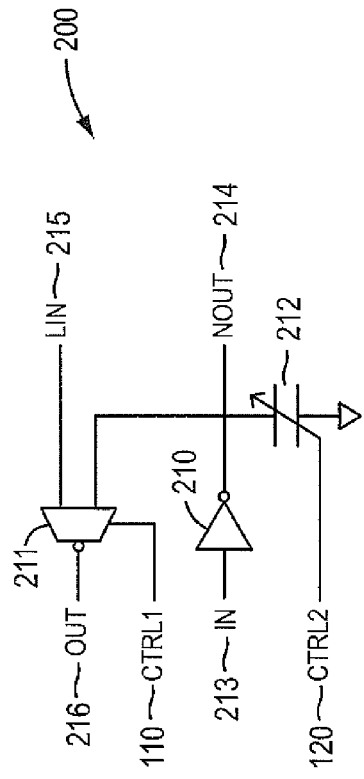
FIG. 1
FIG. 2

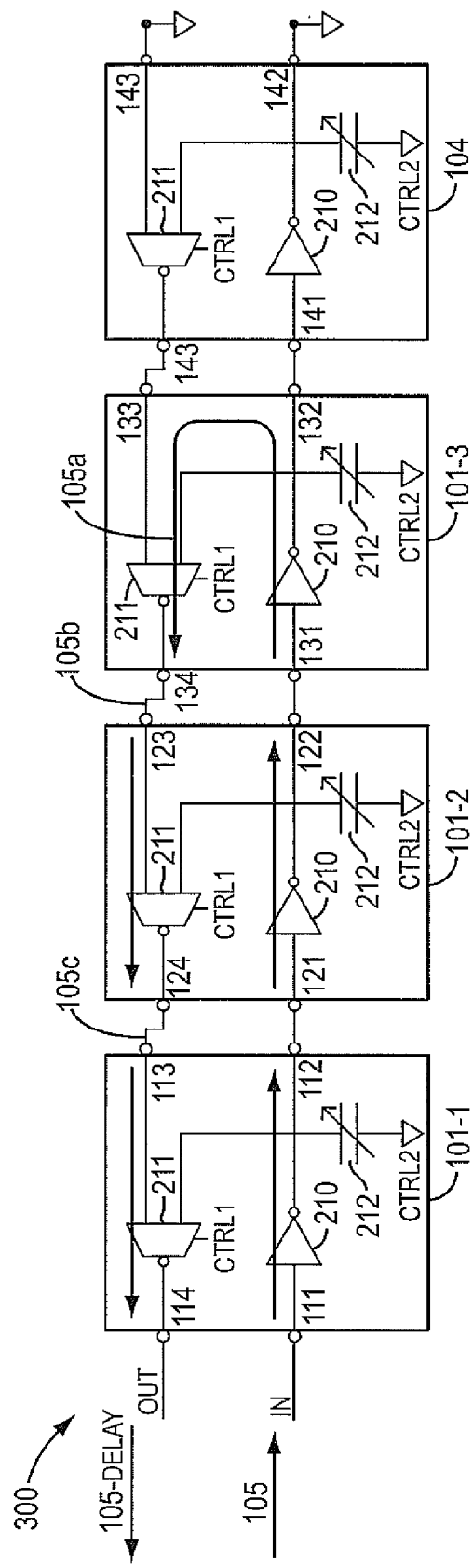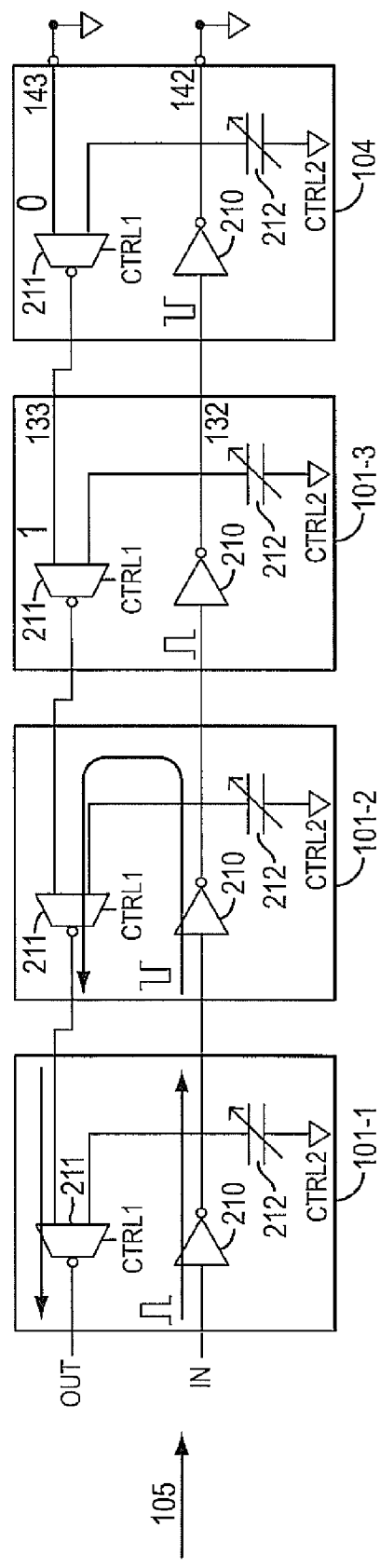
FIG. 3
FIG. 4

LINEAR MONOTONIC DELAY CHAIN CIRCUIT

BACKGROUND

1. Field of the Invention

The present invention relates to integrated circuits and, in particular, to systems and methods for generating adjustable delay.

2. Discussion of Related Art

Improvement of both design techniques and process technology have yielded considerable increase in the speed of integrated circuit (IC) devices. Many IC devices operating at high clock rates have precise timing requirements. For example, new generations of memory chips communicate with other chips in a system at increasingly faster speeds. Thus, the time between applying a read signal in one clock domain, sampling in another clock domain, and generating an output signal in response to the read signal in the system is precisely controlled.

Generally, it is desirable to implement a delay chain circuit that generates linear and monotonic delay steps because circuits with non-linear and non-monotonic delay steps introduce clock skews and decrease overall performance for the IC. Moreover, high resolution delay steps are needed in order to achieve precise timing control. Additionally, it is always desirable to implement a circuit that operates at low power. Existing implementations of delay chain circuits may exhibit some, but not all, of the above desired characteristics and thus suffer from limitations related to timing accuracy or circuit performance. For example, a conventional delay chain circuit can be realized by implementing an inverter chain which is composed of a desired number of invertors. A disadvantage of such a delay chain circuit is that its delay steps are too large and thus cannot be accurately adjusted to meet precise timing requirements.

Therefore, it is desirable to develop delay chain circuits better able to address more of the desired properties, i.e., linear, monotonic, adjustable high resolution delay steps, and low power generation of timing delays.

SUMMARY

In accordance with some embodiments of the present invention, a delay chain circuit includes one or more delay cells coupled serially and a load cell coupled in series with the one or more delay cells, wherein an input signal to the delay chain circuit passes through a determined number of the one or more delay cells according to a first control signal, and wherein a signal delay time in each of the determined number of the one or more delay cells depends on a second control signal.

In some embodiments, the one or more delay cells may comprise an inverter coupled to receive a first input signal and generate a first output signal; a programmable capacitor coupled between an output pin of the inverter and ground; and a nor-multiplexer coupled to receive the first output signal from the inverter and a second input signal and generates a second output signal, wherein the nor-multiplexer generates the second output signal according to the first control signal, and wherein capacitance of the programmable capacitor is controlled by the second control signal.

Further, in some embodiments, the load cell may comprise an inverter coupled to receive an input signal; a programmable capacitor coupled between the output pin of the inverter and ground; and a nor-multiplexer having a first input terminal coupled to ground and a second input terminal coupled to the output pin of the inverter, wherein a control signal to the nor-multiplexer is set such that an output signal is based on a signal on the first input terminal.

In accordance with some embodiments of the present invention, a circuit includes an inverter coupled to receive a first input signal and generate a first output signal; a programmable capacitor coupled between an output pin of the inverter and ground; a nor-multiplexer coupled to receive the first output signal from the inverter and a second input signal and to generate a second output signal; a first control signal coupled to the nor-multiplexer; and a second control signal coupled to the programmable capacitor, wherein the nor-multiplexer generates the second output signal according to the first control signal, and wherein capacitance of the programmable capacitor is controlled by the second control signal.

In accordance with some embodiments of the present invention, a method for delaying a signal includes passing the signal through a determined number of serially coupled delay cells, wherein a load cell is coupled in series with the one or more delay cells, the determined number of one or more delay cells depends on a first control signal, and a delay time introduced to the signal by each of the determined number of the one or more delay cells depends on a second control signal.

In some embodiments, passing the signal through a determined number of one or more delay cells coupled serially may comprise passing the signal through an inverter in each of the determined number of one or more delay cells; passing the signal through a programmable capacitor in the each of the determined number of one or more delay cells, wherein the programmable capacitor is coupled between an output pin of the inverter and ground, and wherein capacitance of the programmable capacitor depends on the second control signal; and passing the signal through a nor-multiplexer in the each of the determined number of one or more delay cells, wherein the nor-multiplexer is coupled to at least the output pin of the inverter, and wherein the nor-multiplexer is controlled by the first control signal.

In accordance with some embodiments of the present invention, a method for delaying a signal includes passing the signal through an inverter; passing the signal through a programmable capacitor coupled between an output pin of the inverter and ground, wherein capacitance of the programmable capacitor depends on a second control signal; and passing the signal through a nor-multiplexer coupled to at least the output pin of the inverter, wherein the nor-multiplexer is controlled by a first control signal.

It is to be understood that both the foregoing general description and the following detailed description are exemplary and explanatory only and are not restrictive of the invention, as claimed. These and further embodiments of the invention are further described below with respect to the following drawings, which are incorporated in and constitute a part of this specification.

BRIEF DESCRIPTION OF THE DRAWINGS

FIG. 1 shows a schematic diagram illustrating a delay chain circuit that includes one or more delay cells and a load cell consistent with some embodiments of the present invention.

FIG. 2 shows a schematic diagram illustrating the topology of delay cells in the circuit as shown in FIG. 1 consistent with some embodiments of the present invention.

FIG. 3 shows a schematic diagram illustrating an exemplary path of a signal in the delay chain circuit as shown in FIG. 1.

FIG. 4 shows a schematic diagram illustrating low power operation of a delay chain circuit consistent with some embodiments of the present invention.

Figure 5A:
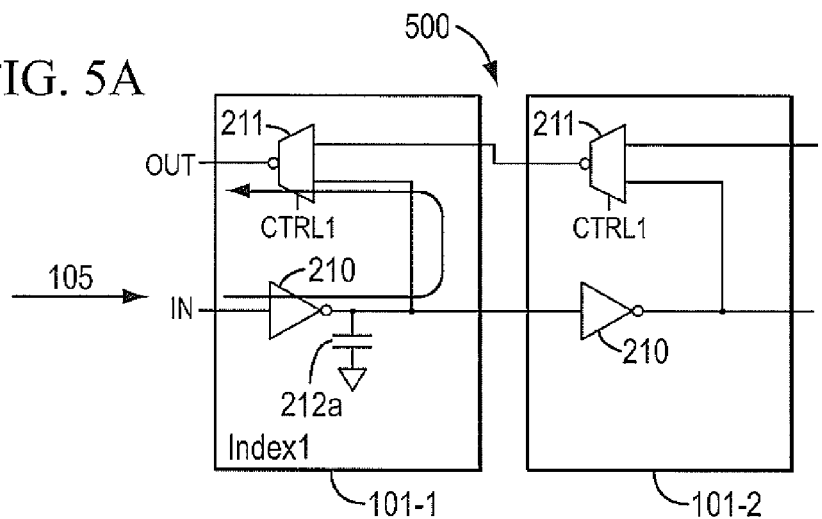
FIGS. 5A through 5F show a series of schematic diagrams illustrating how the delay chain circuit shown in FIG. 1 delays a signal with adjustable linear and monotonic delay steps consistent with some embodiments of the present invention.

In the figures, elements having the same designation have the same or similar function.

DETAILED DESCRIPTION

FIG. 1 shows a schematic diagram illustrating an embodiment of a delay chain circuit 100 that is consistent with the present invention. As shown in FIG. 1, delay chain circuit 100 includes one or more delay cells such as delay cells 101-1 through 101-N and a load cell 104 coupled in series. The number of delay cells N is selected according to a desired range of total delay to be achieved by delay chain circuit 100. Control signals CTRL1 and CTRL2 are coupled to each delay cell of delay cells 101-1 through 101-N and load cell 104 in delay chain circuit 100. In some embodiments, control signals CTRL1 and CTRL2 are transferred from memory buses MUXC 106 and CAPC 107, respectively. Values of control signals CTRL1 and CTRL2 are selected according to the desired range of total delay associated with delay chain circuit 100 and the desired delay time for a specific application of delay chain circuit 100.

Delay cell 101-1 receives a signal 105, and signal 105 is delayed by passing through one or more delay cells in the delay chain circuit 100. The number of delay cells that signal 105 passes through is determined by the values of control signal CTRL1, which is selected according to a desired delay to be introduced to signal 105. Path 1 shown in FIG. 1 illustrates an exemplary path that signal 105 passes through in delay chain circuit 100. As shown, the signal path does not pass through load cell 104. Although FIG. 1 illustrates the signal passing through each of delay cells 101-1 through 101-N, the signal can pass through any number of delay cells 101-1 through 101-N.

FIG. 2 shows a schematic diagram illustrating a delay cell 200, which is an arbitrary one of delay cells 101-1 through 101-N and load cell 104 in delay chain circuit 100 shown in FIG. 1. Delay cell 200 has two input terminals, IN 213 and LIN 215, and two output terminals, OUT 216 and NOUT 214. Load cell 104 shown in FIG. 1 has the same structure as delay cell 200, except that LIN 215 is coupled to ground. As a result, in some embodiments each delay cell operates in the same environment such that the delay associated with each delay cell is uniform. The embodiment of delay cell 200 shown in FIG. 2 includes an inverter 210, a two-to-one nor-multiplexer ("Nor-MUX") 211, and a programmable capacitor 212. The input terminal of inverter 210 is coupled to IN 213 and the output terminal of inverter 210 is coupled to NOUT 212, which is also one end of programmable capacitor 212. Two-to-one Nor-MUX 211 can be a two-to-one multiplexer with an inverted output. Nor-MUX 211 has one input terminal coupled to LIN 215 and the other input terminal coupled to NOUT 214, which is also coupled to one end of programmable capacitor 212. A control signal CTRL1 on terminal 110 is also coupled to Nor-MUX 211. Nor-MUX 211 selects one of the two input signals based on the value of control signal CTRL1 on terminal 110 and generates an output signal to terminal OUT 216. The output signal on terminal OUT 216, then, is the inverted signal of either the output signal from inverter 210 or the input signal on LIN 113. Programmable capacitor 212 includes one or more unit capacitors, such that the capacitance of programmable capacitor 212 depends on the number of unit capacitors that are turned on, or engaged. The number of active unit capacitors is in turn controlled by the value of control signal CTRL2 on terminal 120, which is based on a desired delay.

Control signal CTRL1 on terminal 110 controls the operation of NOR-MUX 211. Although any signaling scheme can be utilized, in one example if CTRL1 is 1 then Nor-MUX 211 selects the output signal of inverter 210 and if CTRL1 is 0 then Nor-MUX 211 selects the signal on LIN 215. As a result, referring to FIG. 1, CTRL1 is set to 0 for each of delay cells 101-1 through 101-(N−1) so that, in those delay cells, Nor-MUX 211 selects the output of the next delay cell in the chain. CTRL1 is set to 1 for delay cell 101-N so that Nor-MUX 211 of delay cell 101-N chooses the output of inverter 210 instead. Therefore, the input signal passes through all of the delay cells up to and including delay cell 101-N. Similarly, the value of CTRL2 for each of delay cells 101-1 through 101-N is set to determine the number of capacitors that are active in programmable capacitor 212 of each of delay cells 101-1 through 101-N.

FIG. 3 shows a schematic diagram illustrating an exemplary path of signal 105 in the delay chain circuit 100 as shown in FIG. 1, according to a desired delay to be introduced to signal 105. Signal 105 is the input to input terminal 111, and passes through inverter 210 of delay cell 101-1 to output terminal 112. Upon exiting delay cell 101-1 through output terminal 112, signal 105 then enters delay cell 101-2 through terminal 121 and passes through inverter 210 of delay cell 101-2. Upon exiting delay cell 101-2 through terminal 122, signal 105 then enters delay cell 101-3 through terminal 131 and passes through inverter 210 of delay cell 101-3. Control signal CTRL1 on terminal 110 of delay cell 101-3 is selected such that Nor-MUX 211 of delay cell 101-3 selects signal 105a, which is signal 105 after passing through inverter 210 of delay cell 101-3, and generates signal 105b by inverting signal 105a. Signal 105b becomes one input to Nor-MUX 211 of delay cell 101-2 though input pin 123. The value of control signal CTRL1 on terminal 110 of delay cell 101-2 is selected such that Nor-MUX 211 of delay cell 101-2 generates signal 105c by selecting and inverting signal 105b. Similarly, based on the value of control signal CTRL1 on terminal 110 of delay cell 101, Nor-MUX 211 of delay cell 101-1 generates an output signal 105_delay by selecting and inverting signal 105c. Signal 105_delay is signal 105 with the desired delay. In the example of FIG. 3, then, control signal CTRL1 for delay cells 101-1 and 101-2 can, for example, be set to 0 and control signal CTRL1 for delay cell 101-3 set to 1.

FIG. 4 shows a schematic diagram illustrating how some embodiments of delay chain circuit 100 shown in FIG. 1 operate on low power. The components shown in FIG. 4 are CMOS standard cells. In FIG. 4, signal 105 is controlled to pass through delay cells 101-1 and 101-2 only, and delay cell 101-3 and load cell 104 are not utilized. In this situation, delay cell 101-3 and load cell 104 are not utilized because Nor-MUX 211 of delay cell 101-3 and Nor-MUX 211 of load cell 104 are arranged to always select a fixed input, the input from input pins 133 and 143, respectively, to generate its output. In other words, the control signal CTRL1 for both of delay cell 101-3 and load cell 104 is set to select the signal on LIN 215. Since input pin 143 is connected to ground, Nor-MUX 211 of load cell 104 will always output a signal with a logic value "1" to delay cell 101-3, and Nor-MUX 211 of delay cell 101-3 will in turn output a signal with logic value "0" to delay cell 101-2. Thus, any delay cell in delay chain circuit 100 that is not used to introduce delay for signal 105, such as delay cell 101-3 and load cell 104 in FIG. 4, are non-operative to save power. In the example shown in FIG. 4, control signal CTRL1 to Nor-MUX 211 in delay cell 101-1 and delay cell 101-3 is set to 0 while control signal CTRL1 to Nor-MUX 211 of delay cell 101-2 is set to 1.

A power savings is realized in the arrangement of FIG. 4 because Nor-MUX 211 of delay cell 101-3 and Nor-MUX 211 of load cell 104 have fixed inputs that do not change. Therefore, there is no switching of the output signals from Nor-MUX 211 of delay cell 101-3 or Nor-MUX 211 of load cell 104.

Figure 5B:
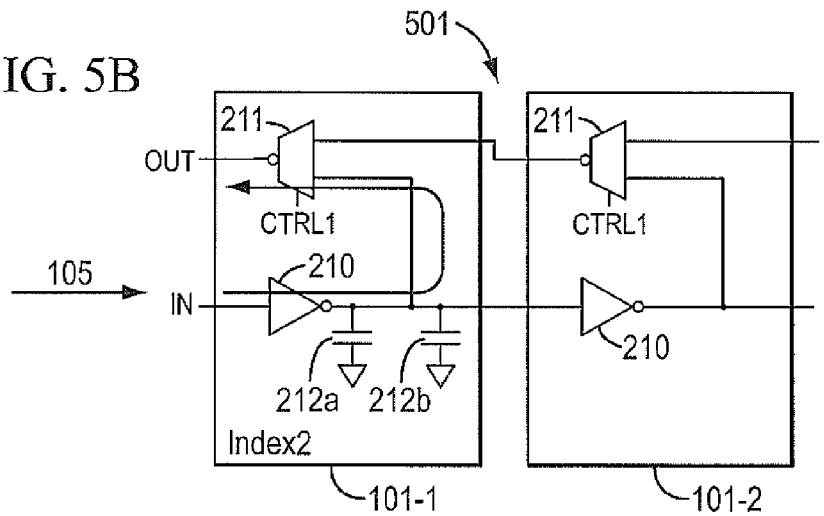
Figure 5C:
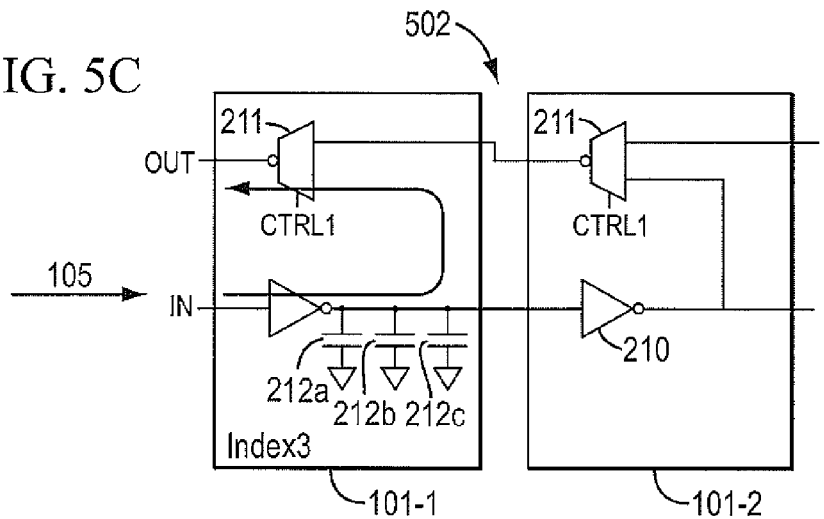

FIGS. 5A-5F show a series of schematic diagrams illustrating how some embodiments of the delay chain circuit 100 as shown in FIG. 1 delays a signal with adjustable linear and monotonic delay steps, consistent with some embodiments of the present invention. In FIGS. 5A-5F, systems 500, 501, 502, 503, 504, and 505, respectively, illustrate delay chain circuit 100 configured for different delay times. For illustrative purposes only, each of systems 500, 501, 502, 503, 504, and 505 shows two delay cells, delay cells 101-1 and 101-2. In addition, each of systems 500, 501, 502, 503, 504, and 505 illustrates different delay times in a sequence of delay times introduced to signal 105. D1, D2, D3, D4, D5, and D6 are used to denote delay time associated with systems 500, 501, 502, 503, 504, and 505, respectively. For illustrative purposes, the programmable capacitor (i.e., programmable capacitor 212) in each delay cell (e.g., delay cell 101-1) in delay chain circuit 100 includes three unit capacitors, 212a, 212b, and 212c, as shown in FIG. 5C. Control signal CNTRL2, then, denotes the number of unit capacitors (0, 1, 2, or 3) that are engaged in each of the delay cells. $T_{delayinv}$ is used to denote the delay time associated with inverter 210 in each of delay cells 101-1 through 101-N. $T_{delaymux}$ is used to denote the delay time associated with the Nor-MUX 211 in each of delay cells 101-1 through 101-N in delay chain circuit 100. $T_{delaycap}$ is used to denote the delay time associated with a unit capacitor (e.g., unit capacitor 212a, unit capacitor 212b, and unit capacitor 212c of variable capacitor 212 in delay cells 101-1 through 101-N).

In system 500 shown in FIG. 5A, signal 105 passes through inverter 210 of delay cell 101-1, unit capacitor 212a of variable capacitor 212 in delay cell 101-1, and Nor-MUX 211 of delay cell 101-1. This is accomplished by, for example, setting control signal CTRL1 in delay cell 101-1 such that Nor-MUX 211 of delay cell 101-1 accepts the output signal from inverter 210 of Nor-MUX 211 and setting control signal CTRL2 for delay cell 101-1 to select a single unit capacitor, capacitor 212a. Therefore, system 500 has a delay time of $$D1 = 1*T_{delayinv} + 1*T_{delaymux} + 1*T_{delaycap}. \quad (1)$$

Similarly, system 501 is configured to add a second capacitor, capacitor 212b, in variable capacitor 212 of delay cell 101-1. This can be accomplished by changing control signal CTRL2 for delay cell 101-1 to select two single unit capacitors, capacitors 212a and 212b, instead of the one single unit capacitor that was selected in system 500 of FIG. 5A. Therefore, system 501 has a delay time of $$D2 = 1*T_{delayinv} + 1*T_{delaymux} + 2*T_{delaycap}, \quad (2)$$

because signal 105 now passes through both unit capacitor 212a and unit capacitor 212b.

System 502 illustrated in FIG. 5C, therefore, has a delay time of $$D3 = 1*T_{delayinv} + 1*T_{delaymux} + 3*T_{delaycap} \quad (3)$$

because control signal CTRL2 for delay cell 101-1 has been set to select three capacitors, capacitors 212a, 212b, and 212c, instead of the two capacitors that are selected in system 501 of FIG. 5B.

Figure 5D:
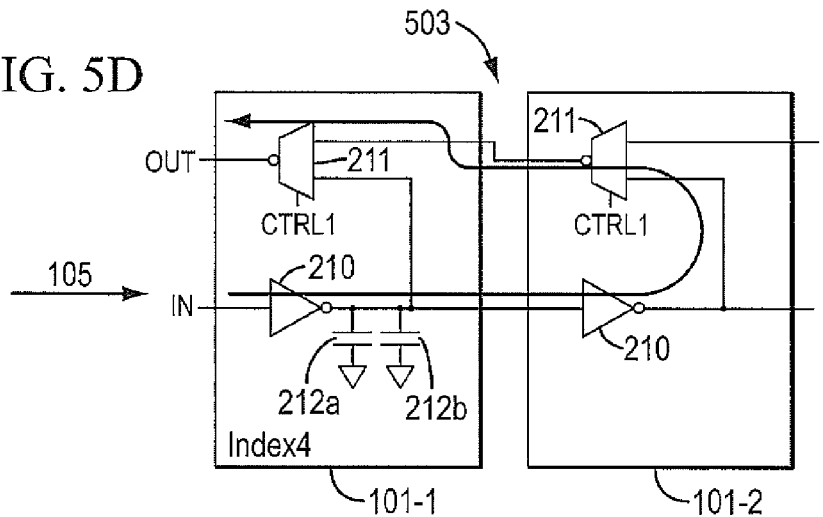

As illustrated here, D1, D2, and D3 only involve delay cell 101, and the delay step is $T_{delaycap}$ thus, in order for delay chain circuit 100 to introduce linear and monotonic delay time to signal 105, the next delay time D4, which is achieved in system 503 shown in FIG. 5D, should be arranged to be $$D4 = D3 + 1*T_{delaycap}. \quad (4)$$

System 503 is configured such that signal 105 passes through inverter 210 of delay cell 101-1, inverter 210 of delay cell 101-2, Nor-MUX 211 of delay cell 101-2, and Nor-MUX 211 of delay cell 101-1, and a number n of unit capacitors in programmable capacitor 212 of delay cells 101-1 and 101-2. As a result, D4 is given by:

$$D4 = 2*T_{delayinv} + 2*T_{delaymux} + n*T_{delaycap}. \quad (5)$$

Combining equations (3), (4), and (5) above, n is found to be $$n = 4 - \Delta, \quad (6)$$

where $$\Delta = \frac{T_{delayinv} + T_{delaymux}}{T_{delaycap}}. \quad (7)$$

As seen from equation (6), the capacitances of the unit capacitors in programmable capacitor 212 should be chosen so that $\Delta$ is an integer that is no greater than 4.

In general, variable capacitor 212 can include any number M of unit capacitances. In that case, a second delay cell is not needed until a configuration with a time delay of $$T_{Del} = 1*T_{delayinv} + 1*T_{delaymux} + (M+1)*T_{delaycap} \quad (8)$$

is requested (a time delay of $1*T_{delayinv} + 1*T_{delaymux} + M*T_{delaycap}$ being achievable in delay cell 101-1). In that case, the delay when adding second delay cell 101-2 becomes $$T_{Del} = 2*T_{delayinv} + 2*T_{delaymux} + n*T_{delaycap}. \quad (9)$$

Equating Equations (8) and (9) results in the relationship $$n = (M+1) - \Delta. \quad (10)$$

Therefore, in the general case, in order to achieve a monotonic increase in available delays the capacitances of variable capacitor 212 is chosen such that $\Delta$ is an integer less than M+1. Further, when the next delay cell is activated, the total number of unit capacitors engaged in variable capacitors 212 for all of the engaged delay cells 101-1 through 101-N is decreased to accommodate the increased delay time due to the additional inverter 210 and Nor-MUX 211. Some embodiments may not need a monotonic increase, in which case Equations (8) and (9) may not be simultaneously achieved.

In the particular example illustrated in FIG. 5D, because n is less than 4, the value of control signal CTRL2 for delay cell 101-1 can be adjusted to decrease the number of active unit capacitors. In FIG. 5D, for illustrative purposes $\Delta$ is assumed to be 2. Thus, in FIG. 5D, n is equal to 2 and the delay time is given by $$D4 = 2*T_{delayinv} + 2*T_{delaymux} + 2*T_{delaycap}. \quad (11)$$

Additionally, two of the unit capacitances are activated, in this example both in programmable capacitor 212 of delay cell 101-1. Therefore, in the example shown in FIG. 5D, control signal CTRL1 for delay cell 101-1 is set such that Nor-MUX 211 of delay cell 101-1 selects the signal coming from delay cell 101-2; control signal CTRL2 for delay cell 101-1 is set such that variable capacitor 212 engages two unit capacitors, 212a and 212b; control signal CTRL1 for delay cell 101-2 is set such that Nor-MUX 211 of delay cell 101-2 selects the output signal from inverter 210 of delay cell 101-2; and control signal CTRL2 of delay cell 101-2 is set such that none of the unit capacitors of variable capacitor 212 is engaged.

Figure 5E:
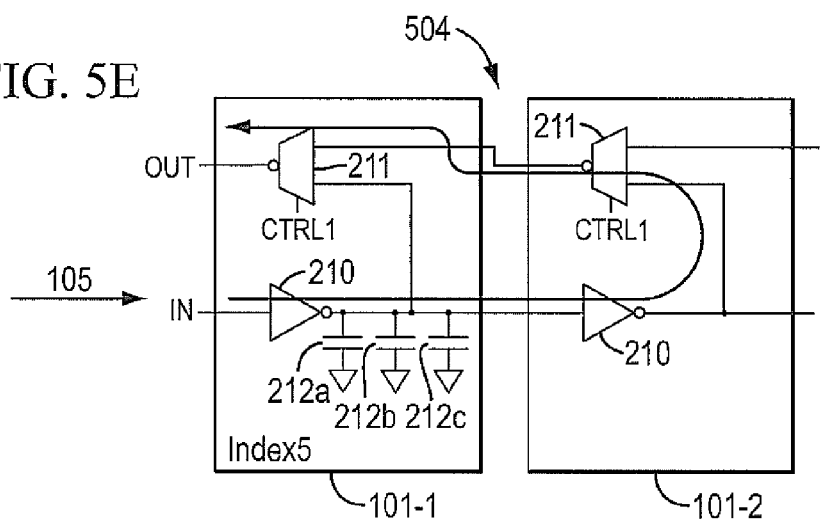

As shown in FIG. 5E, the next delay time, $$D5=2*T_{delayinv}+2*T_{delaymux}+3*T_{delaycap}, \quad (12)$$

is achieved by setting control signal CTRL2 for delay cell 101-1 such that all three unit capacitors, capacitors 212a, 212b, and 212c, are engaged.

Figure 5F:
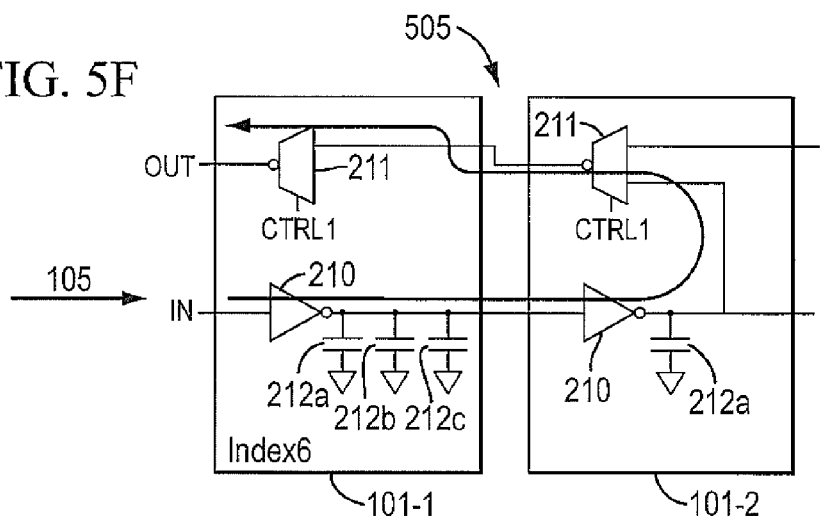

As shown in FIG. 5F, the next delay time, $$D6=2*T_{delayinv}+2*T_{delaymux}+4*T_{delaycap}, \quad (13)$$

is achieved by then setting control signal CTRL2 for delay cell 101-2 such that one unit capacitor, capacitor 212a, of variable capacitor 212 is engaged.

As stated above, the desired range of total delay associated with delay chain circuit 100 and the specific desired delay time are controlled by selecting the values of control signals CTRL1 and CTRL2. Furthermore, since the delay time associated with each unit capacitor of variable capacitor 212 is often much shorter than that associated with an inverter and multiplexer, delay chain circuit 100 is capable of generating delay time with higher resolution delay steps comparing to a conventional delay chain circuit composed of inverter chains. Therefore, some embodiments of delay chain circuit 100 are capable of generating linear and monotonic delay times with high resolution delay steps, and can operate on low power as overdesign is avoided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A delay chain circuit, comprising:
one or more delay cells coupled serially; and
a load cell coupled in series with the one or more delay cells, wherein:
an input signal to the delay chain circuit passes through a number of the one or more delay cells according to a first control signal of each of the one or more delay cells;
a signal delay time in each of the determined number of the one or more delay cells depends on a second control signal input to each of the one or more delay cells; and
each of the one or more delay cells and the load cell includes a programmable capacitor, the programmable capacitor engaging a number of unit capacitors determined by the second control signal,
wherein the programmable capacitor is coupled between an output pin of the inverter and a ground,
wherein the second control signal is a serial control line,
wherein each of the one or more delay cells and the load cell comprises an inverter coupled to receive a first input signal and generate a first output signal and a nor-multiplexer coupled to receive the first output signal from the inverter and a second input signal, and to generate a second output signal equal to either the first output signal or the second input signal according to the first control signal.

2. The delay chain circuit of claim 1, wherein the programmable capacitor includes M unit capacitors, the value of the unit capacitance chosen such that $$\Delta = \frac{T_{delayinv} + T_{delaymux}}{T_{delaycap}},$$

wherein $\Delta$ is an integer no greater than M+1, where $T_{delayinv}$ is the time delay of the inverter, $T_{delaymux}$ is the time delay of the nor-multiplexer, and $T_{delaycap}$ is the time delay of the unit capacitor.

3. The delay chain circuit of claim 1, wherein the first input signal of one of the one or more delay cells is the first output signal of an immediately preceding delay cell and the second input signal of the one of the one or more delay cells is the second output signal of an immediately following delay cell.

4. A method for delaying a signal, the method comprising:
passing the signal through a determined number of one or more delay cells coupled serially, wherein:
a load cell is coupled in series with the one or more delay cells;
the determined number of one or more delay cells depends on a first control signal;
a delay time introduced to the signal by each of the determined number of the one or more delay cells depends on a second control signal, wherein the second control signal is a serial control line;
passing the signal through a determined number of one or more delay cells coupled serially comprises passing the signal through an inverter and a programmable capacitor coupled between an output pin of the inverter and a ground in the each of the determined number of one or more delay cells, wherein a capacitance of the programmable capacitor depends on the second control signal; and
passing the signal through a nor-multiplexer coupled to at least the output pin of the inverter, wherein the nor-multiplexer is controlled by a first control signal.

* * * * *